(12) United States Patent
Butler et al.

(10) Patent No.: US 8,705,213 B2
(45) Date of Patent: Apr. 22, 2014

(54) MAGNETIC FIELD DETECTING DEVICE WITH SHIELDING LAYER AT LEAST PARTIALLY SURROUNDING MAGNETORESISTIVE STACK

(75) Inventors: William Hill Butler, Tuscaloosa, AL (US); Dimitar V. Dimitrov, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 170 days.

(21) Appl. No.: 12/713,473

(22) Filed: Feb. 26, 2010

(65) Prior Publication Data
US 2011/0211272 A1 Sep. 1, 2011

(51) Int. Cl.
*G11B 5/39* (2006.01)

(52) U.S. Cl.
USPC .......................................... 360/319; 360/324.2

(58) Field of Classification Search
CPC ..... G11B 5/3912; G11B 5/3929; G11B 5/398
USPC ............................................... 360/319, 324.2
See application file for complete search history.

(56) References Cited

U.S. PATENT DOCUMENTS

| 5,695,864 | A | 12/1997 | Slonczewski |
| 5,696,656 | A * | 12/1997 | Gill et al. ....................... 360/319 |
| 6,466,419 | B1 * | 10/2002 | Mao .............................. 360/319 |
| 6,664,784 | B1 * | 12/2003 | Hayashi ......................... 360/313 |
| 6,680,829 | B2 * | 1/2004 | Chen et al. ..................... 360/319 |

(Continued)

FOREIGN PATENT DOCUMENTS

| CN | 1516188 A | 7/2004 |
| CN | 1657967 A | 8/2005 |

(Continued)

OTHER PUBLICATIONS

B. Georges et al, Coupling Efficiency for Phase Locking of a Spin Transfer Nano-Oscillator to a Microwave Current, PRL 101, 017201 (2008).

(Continued)

*Primary Examiner* — Craig A. Renner
(74) *Attorney, Agent, or Firm* — Mueting, Raasch & Gebhardt, P.A.

(57) ABSTRACT

A disclosed device having a principle axis and including a magnetoresistive stack, the magnetoresistive stack having first and second opposing surfaces, the magnetoresistive stack including a free layer, a spacer layer, and a reference layer, wherein the spacer layer is positioned between the first and reference layer, the free layer includes magnetic material having a free magnetic orientation in a first plane; the spacer layer includes nonmagnetic material; and the reference layer includes magnetic material having a pinned magnetic orientation in a second plane, wherein the second plane is perpendicular to the first plane and parallel to the principle axis of the device; an insulating layer at least a portion of the outer surface of the magnetoresistive stack; a shielding layer surrounding at least a portion of the insulating layer; and a conducting layer, wherein the conducting layer provides electrical connection between the magnetoresistive stack and the shielding layer.

19 Claims, 6 Drawing Sheets

(56) References Cited

U.S. PATENT DOCUMENTS

| | | | |
|---|---|---|---|
| 6,680,832 B2 * | 1/2004 | Fontana et al. | 360/324.2 |
| 6,700,760 B1 * | 3/2004 | Mao | 360/324.2 |
| 7,230,845 B1 * | 6/2007 | Wang et al. | 360/324.12 |
| 7,280,325 B1 * | 10/2007 | Pan | 360/319 |
| 7,324,309 B1 * | 1/2008 | Wiesen et al. | 360/319 |
| 7,385,790 B2 | 6/2008 | Inomata et al. | |
| 2002/0191355 A1 * | 12/2002 | Hiramoto et al. | 360/324.2 |
| 2004/0130935 A1 | 7/2004 | Gider et al. | |
| 2005/0041462 A1 * | 2/2005 | Kent et al. | 365/158 |
| 2005/0201018 A1 | 9/2005 | Nagai et al. | |
| 2006/0132990 A1 * | 6/2006 | Morise et al. | 360/324.12 |
| 2007/0030728 A1 * | 2/2007 | Kent et al. | 365/171 |
| 2008/0259508 A2 * | 10/2008 | Kent et al. | 360/324.11 |
| 2009/0021870 A1 | 1/2009 | Pinarbasi | |
| 2009/0052095 A1 * | 2/2009 | Yamada et al. | 360/324 |
| 2009/0296462 A1 * | 12/2009 | Kent et al. | 365/171 |
| 2009/0316303 A1 | 12/2009 | Yamada et al. | |
| 2010/0232072 A1 * | 9/2010 | Dimitrov et al. | 360/319 |

FOREIGN PATENT DOCUMENTS

| | | |
|---|---|---|
| JP | 2004-165441 | 6/2004 |
| JP | 2004-289100 | 10/2004 |
| JP | 2005-286223 | 10/2005 |
| JP | 2009-026442 | 2/2009 |
| JP | 2010-003354 | 1/2010 |

OTHER PUBLICATIONS

W.H. Rippard et al., Injection Locking and Phase Control of Spin Transfer Nano-Oscillators, PRL 95, 067203 (2005).

Office Action issued Jan. 9, 2013, in Japan, Patent Application No. 2011-034328. English language translation included.

CN Office Action for Application No. 201110050869.3 dated May 22, 2013 English translation included.

* cited by examiner

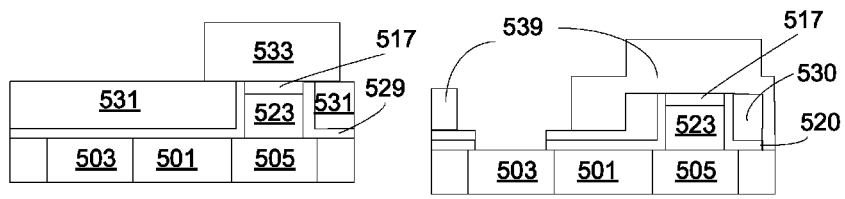
FIG. 5I
FIG. 5M
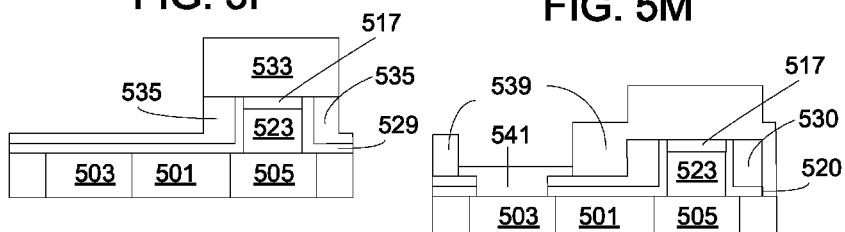
FIG. 5J
FIG. 5N
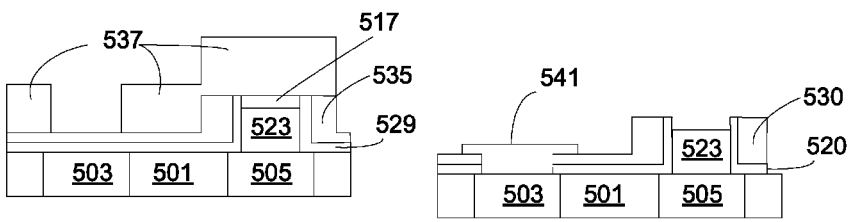
FIG. 5K
FIG. 5O
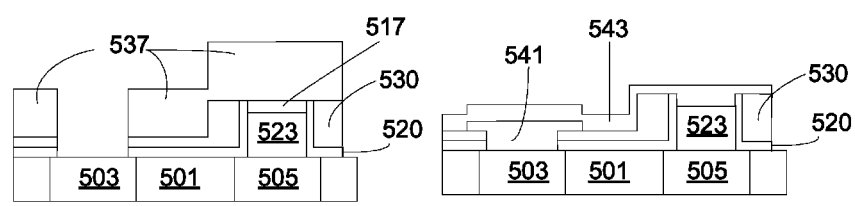
FIG. 5L
FIG. 5P

MAGNETIC FIELD DETECTING DEVICE WITH SHIELDING LAYER AT LEAST PARTIALLY SURROUNDING MAGNETORESISTIVE STACK

BACKGROUND

Advancements in magnetic memory may ultimately achieve areal densities that exceed 5 Tb/inch. Such areal densities will likely require bit aspect ratios (BAR, which equals track width/bit length) from 2 to 1. In order for a reader to achieve the required down-track and cross-track resolution necessary to read from such memory, shielding from all sides will likely be required. At the noted BAR, the magnetic sensor and magnetic biasing elements would need to fit within extremely small areas (a square of 272 $nm^2$ or a rectangle of 253 $nm^2$). Magnetic sensors as currently designed, will be extremely difficult or impossible to scale down to this size. Therefore, there remains a need for novel magnetic sensor designs that can be scaled down to this level.

BRIEF SUMMARY

A disclosed device having a principle axis and including a magnetoresistive stack, the magnetoresistive stack having first and second opposing surfaces, the magnetoresistive stack including a free layer, a spacer layer, and a reference layer, wherein the spacer layer is positioned between the free layer and reference layer, the free layer includes magnetic material having a free magnetic orientation in a first plane; the spacer layer includes a nonmagnetic material; and the reference layer includes a magnetic material having a pinned magnetic orientation perpendicular to the first plane and parallel to the principal device axis; an insulating layer surrounding at least a portion of the outer surface of the magnetoresistive stack; a shielding layer surrounding at least a portion of the insulating layer; and a conducting layer, wherein the conducting layer provides electrical connection between the magnetoresistive stack and the shielding layer.

A disclosed method of using a device, the method including: bringing a magnetic field detecting device in proximity to a magnetic field generating article, wherein the magnetic field detecting device has a principle axis and includes a magnetoresistive stack, the magnetoresistive stack having first and second opposing surfaces, the magnetoresistive stack comprising a free layer, a spacer layer, and a reference layer, wherein the spacer layer is positioned between the free layer and reference layer, the free layer includes magnetic material having a free magnetic orientation in a first plane; the spacer layer includes a nonmagnetic material; and the reference layer includes a magnetic material having a pinned magnetic orientation perpendicular to the first plane and parallel to the principal device axis; an insulating layer surrounding at least a portion of the outer surface of the magnetoresistive stack; a shielding layer surrounding at least a portion of the insulating layer; and a conducting layer, wherein the conducting layer provides electrical connection between the magnetoresistive stack and the shielding layer; directing a current through the magnetic field detecting device; and measuring the resistance of the magnetic field detecting device.

A disclosed method of using a device, wherein the device has a principle axis and includes a magnetoresistive stack, the magnetoresistive stack having first and second opposing surfaces, the magnetoresistive stack comprising a free layer, a spacer layer, and a reference layer, wherein the spacer layer is positioned between the free layer and reference layer, the free layer includes magnetic material having a free magnetic orientation in a first plane; the spacer layer includes a nonmagnetic material; and the reference layer includes a magnetic material having a pinned magnetic orientation perpendicular to the first plane and parallel to the principal device axis; an insulating layer surrounding at least a portion of the outer surface of the magnetoresistive stack; a shielding layer surrounding at least a portion of the insulating layer; and a conducting layer, wherein the conducting layer provides electrical connection between the magnetoresistive stack and the shielding layer; the method including: causing the magnetic orientation of the free layer to rotate; and monitoring the resistance across the magnetoresistive stack in order to detect a magnetic field external to the device.

A method of producing a device including the steps of forming at least a first electrical contact on a substrate; forming a magnetoresistive stack on at least a portion of the first electrical contact; etching the magnetoresistive stack layer to form the magnetoresistive stack; forming an insulating layer surrounding at least a portion of the magnetoresistive stack; and forming a shielding layer surrounding at least a portion of the insulating layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive.

Disclosed herein are devices for detecting magnetic fields. The devices can be utilized for any applications in which the detection of magnetic fields can be useful. The devices advantageously can be used for applications where the detection and measurement of magnetic fields at relatively high resolution is desired. Exemplary applications include magnetic information storage applications (i.e. magnetic memory), and magnetic sensors having nanometer spatial resolution, which can be used in magnetic microscopes for example.

Figure 1A:
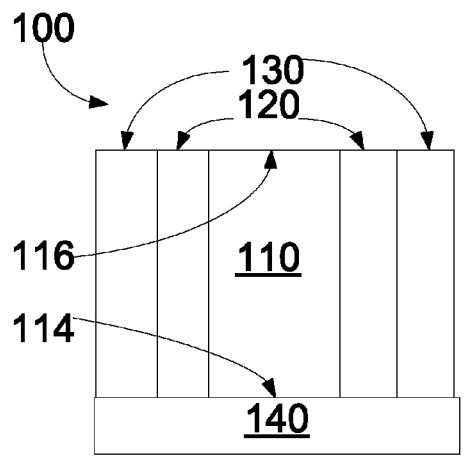
FIGS. 1A and 1B are cross sections of exemplary magnetic field detecting device as disclosed herein.

Disclosed devices include a magnetoresistive stack, an insulating layer, a shielding layer, and a conducting layer. FIG. 1A schematically illustrates an embodiment of a disclosed device. The device 100 seen in FIG. 1A includes a magnetoresistive stack 110, an insulating layer 120, a shielding layer 130, and a conducting layer 140. Generally, the insulating layer 120 is positioned around the periphery of the magnetoresistive stack 110, and the shielding layer 130 is positioned around the insulating layer 120. The conducting layer 140 is generally positioned adjacent one opposing surface of the magnetoresistive stack 110.

Disclosed devices include magnetoresistive stacks. A magnetoresistive stack is generally a multilayer structure. A magnetoresistive stack can generally have any shape. In embodiments, a magnetoresistive stack can be cylindrical. In embodiments, a magnetoresistive stack can be a right circular cylinder, or an elliptic cylinder. In embodiments, the shape or configuration of the magnetoresistive stack can be described by a term called the bit aspect ratio, or BAR. The BAR is the width of the stack divided b the length of the stack. A BAR equal to 1 is therefore analogous to a right circular cylinder, whereas a BAR that is greater than 1, for example 2, is therefore analogous to an elliptical cylinder. The magnetoresistive stack can also be rectangular in shape, where a BAR equal to 1 would be a square.

Figures 2A, 2B:
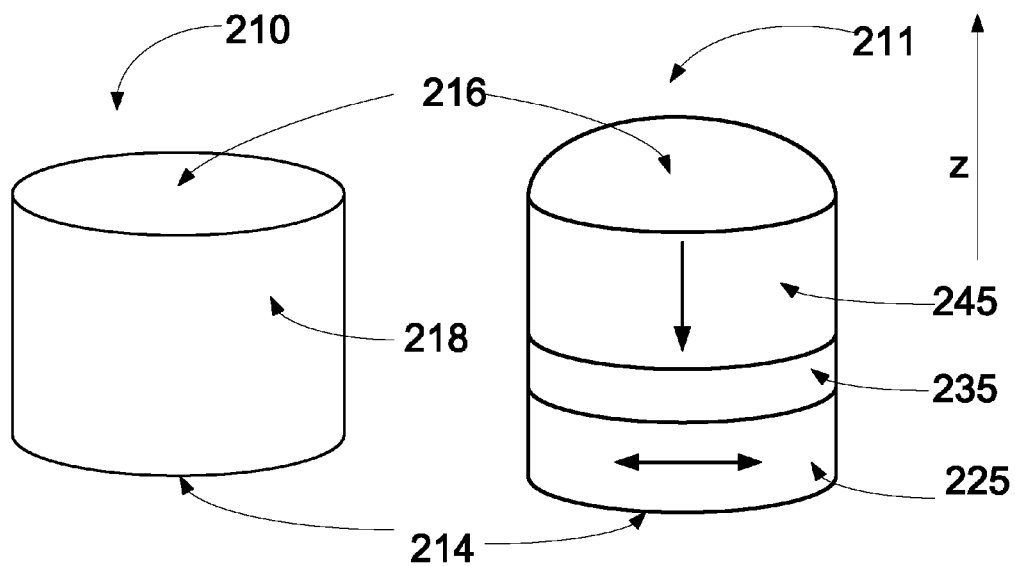
FIGS. 2A and 2B are schematic depictions of magnetoresistive stacks that can be included in magnetic field detecting devices as disclosed herein.

An exemplary magnetoresistive stack is schematically illustrated in FIG. 2A. The magnetoresistive stack 210 has a first surface 214, and a second surface 216, which are opposing. The magnetoresistive stack 210 also has an outer surface 218 that connects the periphery of the first surface 214 to the periphery of the second surface 216.

FIG. 2B schematically illustrates a more specific depiction of a magnetoresistive stack 211. This exemplary magnetoresistive stack 211 includes a free layer 225, a spacer layer 235, and a reference layer 245. The free layer 225 can also be referred to as the first or bottom layer; the spacer layer 235 can also be referred to as the second or middle layer; and the reference layer 245 can also be referred to as the third or top layer. The spacer layer 235 is positioned between the free layer 225 and the reference layer 245. Any one or more of the free layer 225, spacer layer 235, or reference layer 245 can independently be made up of more than one layer, for example can itself be a multilayer structure. The free layer 225, spacer layer 235, and reference layer 245 can also be described as stacked upon one another, with (in one embodiment) the free layer 225 occupying the bottom of the magnetoresistive stack 211, the reference layer 245 occupying the top of the magnetoresistive stack 211, and the spacer layer 235 occupying the middle of the magnetoresistive stack 211. The free layer 225 generally makes up the first surface 214 of the magnetoresistive stack 211; and the reference layer 245 generally makes up the second surface 216 of the magnetoresistive stack 211.

A magnetoresistive stack as included in a disclosed device generally has a principle axis. The principle axis of the magnetoresistive stack 211 runs parallel to the arrow designated z in FIG. 2B. The principle axis is generally along the multiple portions (the free layer 225, the spacer layer 235, and the reference layer 245) of the magnetoresistive stack 211. A disclosed device can also be said to have a principle axis, and it is defined the same as the principle axis of the magnetoresistive stack 211.

A free layer of a magnetoresistive stack generally includes a magnetic material. The magnetic orientation of the magnetic material of the free layer is free in that its orientation can be affected or changed by magnetic fields outside the device. Specifically, the magnetic orientation of the free layer is affected by at least a magnetic field that it is designed or configured to detect. The magnetic orientation of the magnetic material of the free layer is in a first plane. In embodiments, the first plane is perpendicular to the principle axis (as shown by the arrow z) of the magnetoresistive stack.

Generally, the magnetic material making up the free layer is not particularly limited. In embodiments, the magnetic material can be a material with in-plane anisotropy. Materials for the free layer that have in-plane anisotropy can include one or more than one (i.e. a multilayer structure) individual layer. Exemplary materials can include cobalt (Co), iron (Fe), boron (B), nickel (Ni), copper (Cu), and alloys thereof. Exemplary alloys can include CoFe, CoFeB, NiFe, Co/Cu bilayers or multilayers, and CoNiFe. Exemplary alloys can also include $Co_2MnSi$, $Co_2MnGe$, $Co_2FeAl$, and $Co_2FeSi$, MnAl. In embodiments, that utilize MnAl, the MnAl can be textured such that the anisotropy is in-plane.

In embodiments, the free layer does not require in-plane stabilization. The magnetization of the reference layer is along the principal device axis z. To achieve the desired magnetic orientation of the reference layer, strong perpendicular anisotropy in the RL can be created. Due to the fact that the magnetization of the reference layer is perpendicular to the plane of the free layer, the free layer does not need to be stabilized. The magnetization of the free layer can be oriented in any way within the plane of the free layer and the angle between the magnetization of the free layer and the magnetization of the reference layer is always at 90 degree. Perpendicular magnetization orientations can provide the proper bias state without excitation from an external field. Because there is no need for stabilization (in such an embodiment), the free layer can have significantly smaller dimensions, and therefore the material of the free layer can exist in a single domain state. In embodiments, the free layer can have a thickness of about 10 nm. It should also be noted that in embodiments, the free layer can have in-plane stabilization.

Materials for the free layer can also include a bi-layer structure. For example, the free layer can include a top layer (also referred to as a first layer of the free layer) made of a material with in-plane magnetization and a bottom layer (also referred to as a second layer of the free layer) made of a material having perpendicular to the plane intrinsic anisotropy. Such an embodiment has the top layer with in-plane magnetization and the bottom layer with intrinsic anisotropy perpendicular to the top layer. In such an embodiment, the top layer can have sufficiently weak intrinsic anisotropy so that shape anisotropy can keep the magnetization in-plane or nearly in-plane. In such an embodiment, the perpendicular anisotropy of the bottom layer is generally not large enough to bring the magnetization of the entire free layer out of plane, but makes the entire free layer magnetically softer to media fields. Such interplay of the top layer and the bottom layer can improve readback sensitivity in embodiments where the device is utilized to detect magnetic fields in magnetic recording media. Exemplary materials for the top layer of such an embodiment can include Co, CoFe, CoFeB, NiFe, Co/Cu bilayers or multilayers, and CoNiFe. Exemplary materials for the bottom layer of such an embodiment can include FePt, CoPt, CoPd, Co/Cu multilayers, Co/Pt multilayers, Co/Pd multilayers, Fe/Pt multilayers, or Fe/Pd multilayers.

In embodiments where the free layer includes a bilayer structure having an in-plane magnetization top layer and a perpendicular to the plane intrinsic anisotropy bottom layer, additional layers can also be included in the free layer of the magnetoresistive stack. For example, layers can be added to the free layer that are designed to increase the magnetoresistance of the magnetoresistive stack. For example, a layer of CoFeB can be added to the interface of the spacer layer and the free layer to increase the magnetoresistance. In an embodiment, a layer of CoFeB that is at least about 2 nm thick can be added to the interface of the spacer layer and the free layer.

Generally, the material making up the spacer layer, or the spacer layer, is not particularly limited as long as the material is nonmagnetic. In embodiments, the material of the spacer layer can function as a magneto resistive spacer. Exemplary materials include tunneling barrier materials, noble metals, or composite materials that include insulating materials and conducting materials. Exemplary tunneling barrier materials include MgO, $Al_2O_3$, and $TiO_x$. Exemplary noble metals include Cu, Ag, and Au. In embodiments, the noble metals that can be utilized are those that can be used in current perpendicular to the plane (CPP) spin valves. Exemplary composite materials that include insulating materials and conducting materials include $Al_2O_3$/Cu, $Al_2O_3$/Ag, $Al_2O_3$/Au, MgO/Cu, MgO/Ag, MgO/Au, $TiO_x$/Cu, $TiO_x$/Ag, and $TiO_x$/Au. In embodiments, the composite materials that can be utilized are those that can be used in CPP spin valves.

The particular material that is utilized for the spacer layer can lead to different resistances of the overall magnetoresistive stack. For example, in embodiments that utilize tunneling barrier materials, the resistance-area (RA) product can be in the range of 0.1 $\Omega\mu m^2$ to 0.2 $\Omega\mu m^2$. Such a RA product can translate to a resistance in the range of 1 k$\Omega$ to 2 k$\Omega$ when utilized in a device for reading commonly dimensioned magnetic memory. In embodiments that utilize noble metals, such as noble metals that are utilized in CPP spin valves, the RA product can be in the range of 0.01 $\Omega\mu m^2$ to 0.05 $\Omega\mu m^2$. Such a RA product can translate to a resistance in the rage of 200$\Omega$ to 500$\Omega$ when utilized in a device for reading commonly dimensioned magnetic memory. In embodiments that utilize composite materials, such as composite materials that include insulating and conducting materials that are utilized in CPP spin valves, the RA product can be in the range of 0.05 $\Omega\mu m^2$ to 0.1 $\Omega\mu m^2$. Such a RA product can translate to a resistance in the rage of 500$\Omega$ to 1 $\Omega$ when utilized in a device for reading commonly dimensioned magnetic memory. As seen from these examples, the preamp input impedance, as well as the head capacitance (in the context of a reader for memory materials) may be chosen based at least in part on the choice of materials for the spacer layer.

A reference layer, or a reference layer, of a magnetoresistive stack generally includes a magnetic material. The magnetic orientation of the magnetic material of the reference layer is pinned in that it is not affected or changed by magnetic fields that are normally present outside the device. More specifically, the magnetic orientation of the reference layer is at least not affected by magnetic fields that the device is designed or configured to detect. The magnetic orientation of the magnetic material of the reference layer is parallel to the principle axis of the magnetoresistive stack (denoted by z). The principle axis and the reference layer orientation is perpendicular to the first plane (the plane of magnetization of the free layer).

Generally, the magnetic material making up the reference layer is not particularly limited. In embodiments, the reference layer can be made of a single or multiple layers. In embodiments where the reference layer is made of a single layer, an appropriate material can include a material that has both large magnetoresistive effect and perpendicular anisotropy. Exemplary materials for a single layer reference layer include FePt or MnAl.

In embodiments, the reference layer can be made up of a bilayer. The bilayer can have a bottom layer that is in contact with the spacer layer of the magnetoresistive stack; and a top layer that is on top of the bottom layer. The top layer of the reference layer can also form the second surface 216 of the magnetoresistive stack. The top layer can be exchange coupled to the bottom layer. The bottom layer of the reference layer functions along with the free layer and spacer layer to create a magnetoresistive effect in the magnetoresistive stack, while the top layer of the reference layer possesses relatively large perpendicular anisotropy and stabilizes the overall magnetization of the reference layer perpendicular to the plane.

Materials for the bottom layer of the reference layer include Co, Fe, B, Ni, Cu, and alloys thereof. Exemplary alloys can include CoFe, CoFeB, NiFe, Co/Cu bilayers or multilayers, and CoNiFe. Materials for the top layer of the reference layer include Co, Fe, Cu, and alloys thereof. Exemplary alloys can include FePt, CoPt, CoPd, Co/Cu multilayers, Co/Pt multilayers, Co/Pd multilayers, Fe/Pt multilayers or Fe/Pd multilayers.

Various combinations of configurations (single or multilayer) and materials for the free layer, spacer layer, and reference layer are envisioned by the present disclosure, and any such possible combination is to be considered disclosed herein. In embodiments that utilize MgO as the spacer layer, the free layer can include CoFeB. In embodiments that utilize fcc (face cubic centered) 111 multilayers of materials (for example CoPd, CoPt, or CoNi) L10 alloys of materials (for example CoPt, FePd, or FePt) or amorphous alloys including rare earth materials (for example TbFeCo) in reference layers, it may be beneficial to include a layer of CoFeB at the interface of the spacer layer and reference layer. In embodiments, the layer of CoFeB can be at least about 2 nm thick. Such a CoFeB layer can increase the magnetoresistance of the magnetoresistive stack by affecting the templating of the spacer layer.

A device as described herein also includes an insulating layer 120. The insulating layer 120 generally functions to electrically insulate the magnetoresistive stack 110. The placement of the insulating layer 120 within the larger device allows current to be driven through the magnetoresistive stack 110 to the conducting layer 140 and finally to the shielding layer 130 (or vice versa). The insulating layer 120 generally surrounds at least a portion of the magnetoresistive stack 110.

In embodiments, the insulating layer 120 surrounds all but the first surface 114 and the second surface 116 of the magnetoresistive stack 110. In embodiments, the insulating layer 120 surrounds substantially all of the outer surface (see outer surface 218 in FIGS. 2A and 2B) of the magnetoresistive stack 110.

Figure 3A:
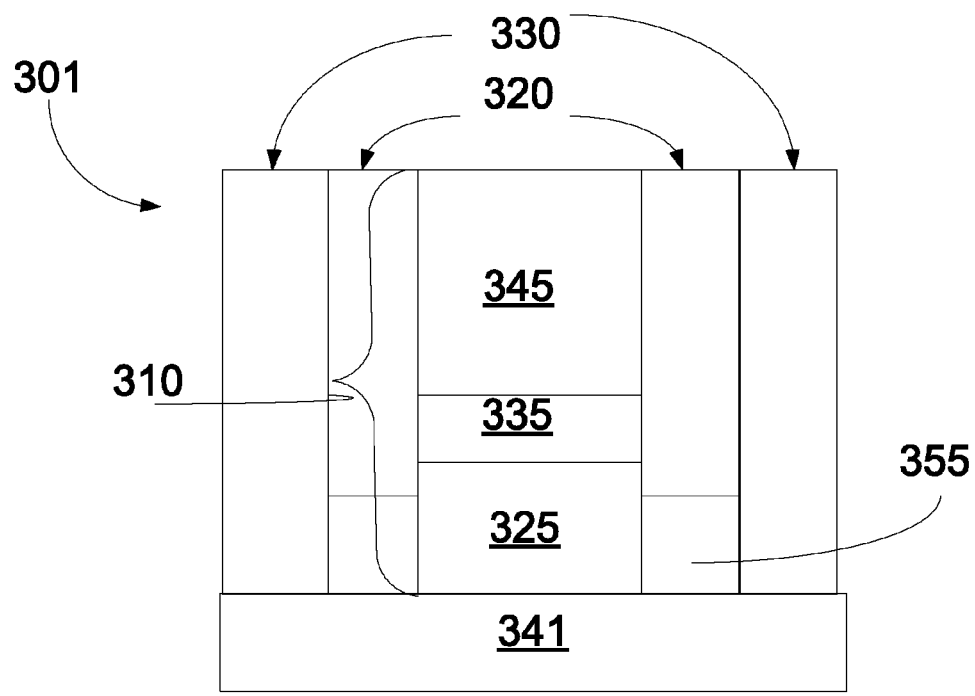
FIGS. 3A and 3B are schematic views of an embodiment of an exemplary magnetic field detecting device.

FIG. 3A illustrates another embodiment of a disclosed device. The device 301 includes the components discussed above with respect to FIG. 1A (with 341 being the conductor layer and 345 being the reference layer) with the exception that the insulating layer 320 can be different. As seen in FIG. 3A, the insulating layer 320 does not surround the entire outer surface of the magnetoresistive stack 310. Instead, there is a portion of the free layer 325 that is not surrounded by the insulating layer 320. Instead, those portions of the free layer 325 can be surrounded by a gap spacer 355. The gap spacer 355 can be a conductive material. The gap spacer 355 is also a non-magnetic material. It should be noted that the insulating layer 320 must be below the spacer layer 335, if not, a current driven through the magnetoresistive stack 310 would not go through the free layer 325.

In embodiments, the insulating layer can have a uniform thickness around the outer surface of the magnetoresistive stack. In embodiments, the insulating layer can have a thickness from about 3 nm to about 5 nm. In embodiments, the insulating layer can have a thickness from about 3 nm to about 5 nm thick. The insulating layer can be made of any material that is electrically insulating. Exemplary materials include alumina ($Al_2O_3$), zirconia ($ZrO_2$), silicon dioxide ($SiO_2$), and silicon nitride ($Si_3N_4$). In embodiments, $Al_2O_3$, $SiO_2$, or SiON can be utilized for the insulating layer.

A device as described herein also includes a shielding layer 130. The shielding layer 130 serves a dual purpose in the device. The shielding layer 130 functions to magnetically shield the magnetoresistive stack 110 from extraneous magnetic influences. For example, in embodiments where the device is configured to detect magnetic fields from magnetic memory, the shielding layer 130 can function to shield the magnetoresistive stack 110 from memory bytes that are not the one being read, i.e., from down-track and cross-track magnetic transitions. The shielding layer 130 also functions as a second electrode (with the reference layer of the magnetoresistive stack 110 or an electrically connected conductive surface thereof) being the first electrode or vice versa) to send current through the magnetoresistive stack 110. The shielding layer 130 generally surrounds at least a portion of the insulating layer 120. In embodiments, the shielding layer 130 surrounds the outer portions of the insulating layer 120 but not the entire surfaces of the insulating layer 120 that are in the same plane as the first surface 114 and the second surface 116 of the magnetoresistive stack 110.

In embodiments, the shielding layer can have a uniform thickness around the outer surface of the insulating layer. In embodiments, the shielding layer can have a thickness from about 0.2 to about 2 μm. The shielding layer can be made of any material that is electrically conducting and magnetically shielding. Exemplary materials include magnetically soft materials having zero or small magnetostriction magnetorestriction. Specific exemplary materials include NiFe (permalloy), derivatives of NiFe, or amorphous materials based on CoZr or FeSi, such materials can also add various amounts of B, Zr, Nb, Cu, Si or Co. In embodiments, the shielding layer can include permalloy or permalloy derivatives that include additives to improve corrosion resistance, texture, or microstructure for example.

A device as described herein also includes a conducting layer 140. The conducting layer 140 serves a dual purpose in the device. The conducting layer 140 functions as an electrode (along with the reference layer of the magnetoresistive stack 110 or an electrically connected conductive surface thereof) as a second electrode) to direct current through the magnetoresistive stack 110. The conducting layer 140 also functions as a protective layer to protect the bottom surface of the device from being damaged by contact or exposure to air. The conducting layer 140 generally covers the entire first surface 114 of the magnetoresistive stack 110 as well as the entire portion of the bottom surface of the insulating layer 120 and at least a portion of the shielding layer 130. It should be noted that the conducting layer 140 need not cover the entire lower surface of the shielding layer 130, only enough to provide an electrical path for the current. In embodiments, the conducting layer 140 can cover the entire lower surface of the shielding layer 130 in order to provide protection from corrosion and mechanical wear from physical contact.

Figure 1B:
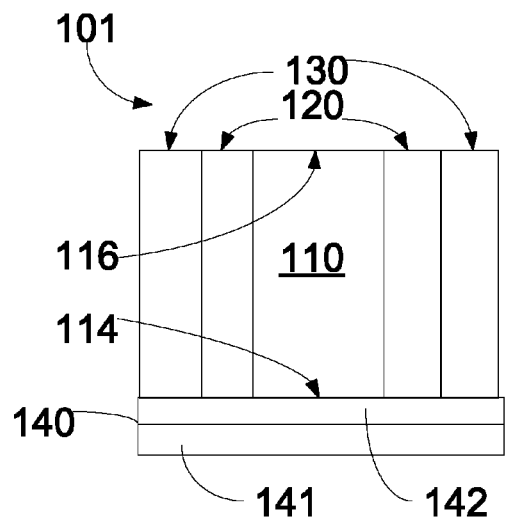

In embodiments, the conducting layer 140 can have a uniform thickness. In embodiments, the conducting layer 140 can have a thickness from about 1 nm to about 3 nm. The conducting layer 140 can be made of a material that has the requisite electrical conductivity, mechanical strength, and corrosion resistance. Generally, the material making up the conducting layer has an electrical conductivity that is at least comparable to copper (Cu), and has the mechanical strength and corrosion resistance of a diamond like coating. The conducting layer 140 can be a single layer or a multilayer structure. An exemplary conducting layer 140 can be a bi-layer of a conductive metal (for example Cu or Ag) and a hard diamond like overcoat. FIG. 1B illustrates an exemplary embodiment of a device 101 that includes a conducting layer 140 that is a bi-layer including a conductive material layer 142 (that could be a conductive nonmetallic material (for example graphene) and a diamond like overcoat layer 141.

Another exemplary conducting layer 140 can be a bi-layer of a highly conductive nonmetallic material (for example graphene) and a hard diamond like overcoat.

Figure 3B:
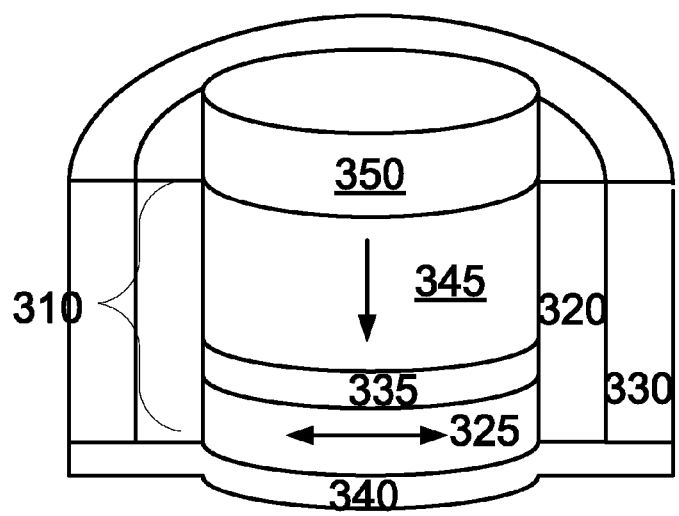

Another embodiment of a disclosed device is schematically depicted in FIG. 3B. This exemplary embodiment includes the components discussed above (with 345 being the reference layer) as well as a contact 350. The contact 350 can function to direct electrical current into the magnetoresistive stack 310. The device can be configured to direct current from the contact 350, through the magnetoresistive stack 310, to the conducting layer 340 and out through the shielding layer 330 (or vice versa). The contact 350 can be made of any electrically conductive material. Exemplary materials for the contact 350 include Ag, Cu, Au, Ni, α-Ta, and Ru. Exemplary materials for the contact 350 include Cu, Ag, or Au.

Figure 4A:
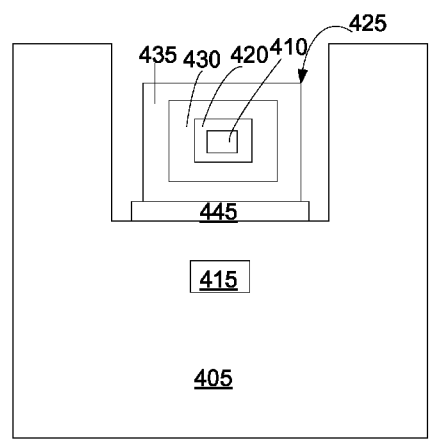
FIGS. 4A and 4B are cross sectional views from the air bearing surface (FIG. 4A) and the side (FIG. 4B) of a device including a disclosed magnetic field detecting devices.
Figure 4B:
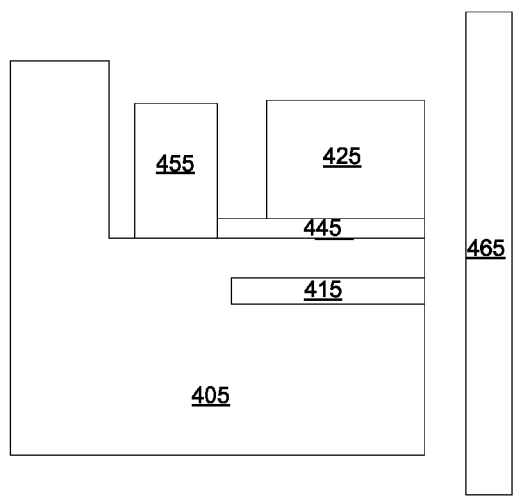

Disclosed devices can be utilized in combination with other devices. In embodiments, a disclosed magnetic field detecting device can be combined with a device that is capable of modulating a magnetic field. In the context of magnetic recording media, the magnetic field detecting device can be referred to as the reader and the magnetic field modulating device can be referred to as the writer. Readers and writers are commonly combined on a slider, which can be utilized to move the location of the reader and writer with respect to the magnetic recording media. FIG. 4 schematically illustrates a view from the air bearing surface (ABS) of the magnetic recording media (FIG. 4A) and a cross section view including the magnetic recording media (FIG. 4B). As seen in these figures, the slider 405 includes the writer 415 and the reader 425. Seen in the ABS view of FIG. 4A is the free layer 410, the insulating layer 420, and the shielding layer 430. The reader 425 also includes a larger body 435 that surrounds the shielding layer 430. Also disclosed in these figures are a mechanically compliant layer 445 and a piezo element 455. FIG. 4B also depicts the magnetic recording media 465.

Devices such as those depicted in FIGS. 4A and 4B may not be able to be fabricated using generally utilized process flows for manufacturing magnetic memory reader/writers because the orientation of the layers is orthogonal to those commonly utilized in conventional writers and readers. One method of manufacturing a disclosed magnetic field detecting device (reader) in combination with a magnetic field forming device (writer) would be to build the reader on a separate wafer, machine and subsequently mount it on a slider containing the writer, in the desired orientation. In embodiments, the portion of the slider where the reader is mounted can be protruded by using a heater or magnetorestrictive element so that the reader is in close proximity to the media.

Figure 5A:
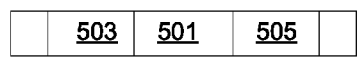
FIGS. 5A through 5P are diagrams depicting an exemplary process flow for manufacturing a disclosed device.

An exemplary method of producing a disclosed device in combination with a writer on the same substrate is depicted and discussed with respect to FIGS. 5A through 5P. One such exemplary method can include steps of forming at least a first electrical contact on a substrate; forming a magnetoresistive stack on at least a portion of the first electrical contact; etching the magnetoresistive stack layer to form the magnetoresistive stack; forming an insulating layer surrounding at least a portion of the magnetoresistive stack; and forming a shielding layer surrounding at least a portion of the insulating layer.

The steps depicted in FIGS. 5A through 5P in no way limit the way in which a magnetic field detecting device as disclosed herein can be fabricated. It should also be noted that the figures are not necessarily to scale and do not necessarily depict the article at every state of preparation, i.e. intermediate stages of the article may not be illustrated in the sequence of figures. The materials and processes discussed with respect to FIGS. 5A through 5P also in no way limit materials or processes that can be utilized herein.

FIG. 5A depicts a substrate 501 in which two electrical contacts 503 and 505 are formed. The electrical contacts 503 and 505 (as well as other steps in this exemplary method) can be formed using various etching and patterning techniques. Patterning generally describes a process or a series of processes that shape or alter the existing shape of the deposited materials and can be referred to as lithography. For example, in conventional lithography, the layer to be patterned can be coated with a chemical called photoresist. It should be noted that some steps specifically mentioned herein specifically show the deposition of photoresist, and some may not. Once deposited, the photoresist can then be exposed by a stepper, a machine that focuses, aligns, and moves a mask, exposing select portions of the layer to light. The unexposed regions can be washed away by a developer solution. After etching or other processing, the remaining photoresist can be removed using various techniques, such as plasma etching. The next step includes forming the magnetoresistive stack 507 on the entire surface of the article. The magnetoresistive stack 507 can be formed various deposition, patterning, and etching techniques as may be necessary.

Figure 5E:
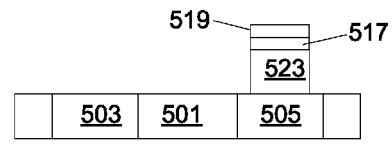
Figure 5B:
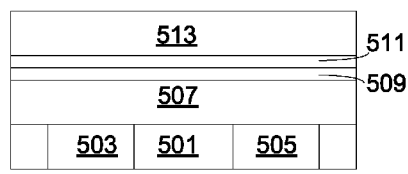
Figure 5F:
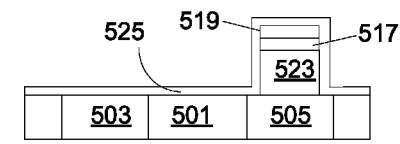
Figure 5C:
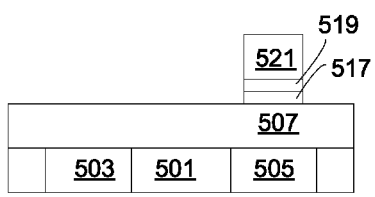
Figure 5G:
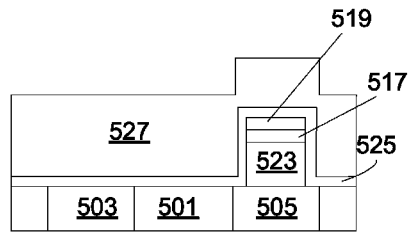
Figure 5D:
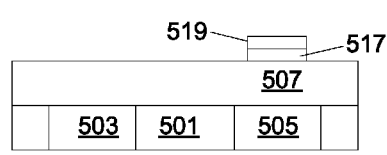

FIG. 5B depicts the substrate 501 with the magnetoresistive stack 507 formed thereon. On the top surface of the magnetoresistive stack layer 507, a hard mask can be deposited. In the example disclosed herein, the hard mask layer includes a thin amorphous carbon layer 509 (in embodiments, the amorphous carbon layer 509 can be about 1 nm thick) and a tantalum (Ta) layer 511 (in embodiments, the tantalum layer 511 can be about 5 nm thick). A photoresist layer 513 can be deposited on top of the tantalum layer 511. FIG. 5C depicts the article after the photoresist layer 513 has been exposed and developed and the unprotected hard mask layers (specifically the amorphous carbon layer 509 and the tantalum layer 511) have been etched to form an etched photoresist layer 521, an etched tantalum layer 519, and an etched amorphous carbon layer 517. FIG. 5D shows the article after the etched photoresist layer 521 has been stripped leaving only the etched tantalum layer 519 and etched amorphous carbon layer 517 (hard mask layers) on the magnetoresistive stack layer 507.

The next step is to etch the magnetoresistive stack layer 507 to form the magnetoresistive stack. In embodiments, this step can be carried out using reactive ion etching (RIE) or inductive coupled plasma (ICP) etching with a high selectivity between tantalum and the magnetoresistive stack material. FIG. 5E shows the article after this step has been accomplished and the article includes the magnetoresistive stack 523 along with the hard mask layers (amorphous carbon layer 517 and tantalum layer 519). The next step is the deposition of the insulating material (for example $Al_2O_3$) that will eventually form the insulating layer of the device. Exemplary techniques for depositing the insulating material include, plasma vapor deposition (PVD), ionized plasma based sputtering, long throw sputtering, chemical vapor deposition (CVD) and atomic layer deposition (ALD). In embodiments, ALD can be utilized to deposit the electrically insulating material on the walls of the article. FIG. 5F shows the article after the insulating material has been deposited to form a raw insulating layer 525. After the insulating material has been deposited, the next step is to deposit the material that will make up the shielding layer (for example NiFe) in the eventual device. In embodiments, sputter deposition methods or sputter deposition methods followed by electrodeposition can be utilized. FIG. 5G shows the article after the shielding material has been deposited to form a raw shielding layer 527.

Figure 5H:
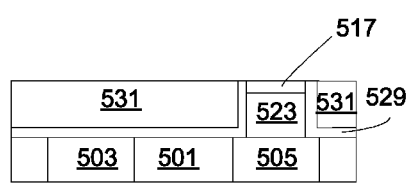

FIG. 5H shows the article after a portion of the raw shielding layer 527 and the raw insulating layer 525 have been removed to form the intermediate insulating layer 529 and the intermediate shielding layer 531. In embodiments, the raw shielding layer 527 can be removed; by for example chemical mechanical planarization (CMP), until the amorphous carbon layer 517 is contacted. Since there are slurries that have very different CMP rates for NiFe (or other magnetic shielding materials) and amorphous carbon (for example, there are slurries that have a CMP rate of amorphous carbon that is about 100 times slower than NiFe), the amorphous carbon layer, even though it is very thin, can be a very good CMP stop layer.

FIG. 5I shows the article after formation of a photoresist structure 533 to form the shielding layer. The photoresist structure 533 can be formed by depositing, exposing, developing and etching photoresist material. After the photoresist structure is formed, it can then be used to etch (by for example ICP, RIE, ion beam etch (IBE)) the intermediate shielding layer 531 to form the shielding portion 535 as seen in FIG. 5J. As seen in FIG. 5J, this etch stops in the shielding material on the periphery of the magnetoresistive stack because some of the magnetic shielding material will form a return electrode in the final device.

FIG. 5K shows the article after stripping the photoresist structure 533, applying new photoresist material, and exposing and developing the new photoresist material to form a second photoresist structure 537 that opens up an area above the second electrode 503. FIG. 5L shows the article after the second photoresist structure 537 was used to etch portions of the intermediate insulating layer 529 and the shielding portion 535 forming the insulating layer 520 and the shielding layer 530. This step exposes the second electrode so that electrical contact can be made therewith. FIG. 5M shows the article after stripping the second photoresist structure 537, applying new photoresist material, and exposing and developing the new photoresist material to form a third photoresist structure 539 that opens an area for electroplating the via that will connect the electrode 503 with the shielding layer 530 that serves as the return electrode. FIG. 5N depicts the article after forming the via 541. The via 541 connects the electrode 503 with the shielding layer 530 so that it can function as a return electrode. In embodiments, the via 541 can be formed by electroplating a conductive material. FIG. 5O depicts the article after the third photoresist structure 539 has been stripped and the amorphous carbon layer 517 has been removed (for example via ashing). The final step in this exemplary method, which is shown as accomplished in FIG. 5P, is the deposition of a conductive material to form the conducting layer 543.

Figure 6:
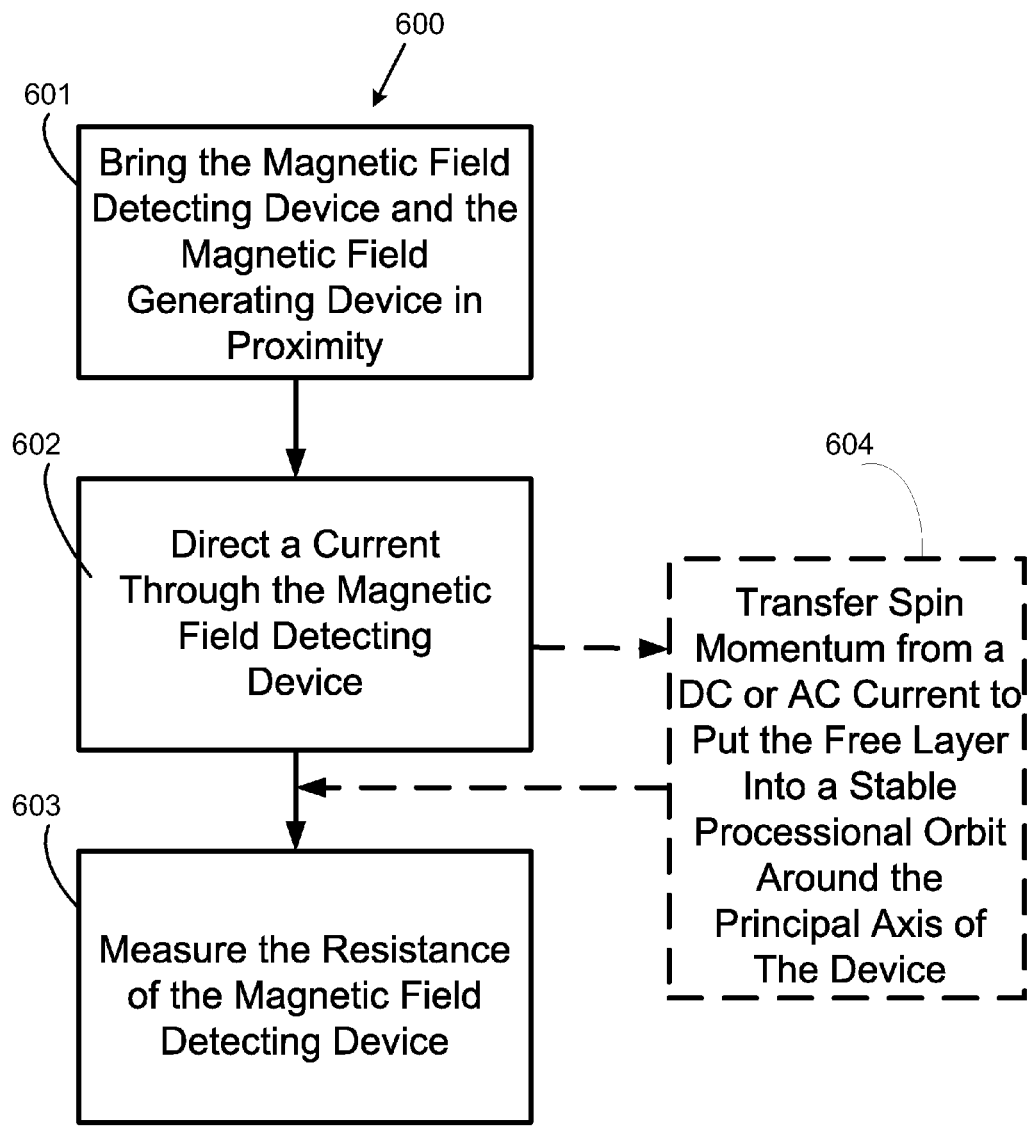
FIG. 6 is a flow diagram exemplifying a disclosed method for using the device.

Methods of using devices as described above are also disclosed herein. More specifically, methods disclosed herein can generally include methods of detecting a magnetic field using a disclosed device. An embodiment of a method 600 is depicted in FIG. 6 and includes step 601, bringing a magnetic field detecting device in proximity to a magnetic field generating article; step 602, directing a current through the magnetic field detecting device; and step 603, measuring the resistance of the magnetic field detecting device.

Step 601, brining a magnetic field detecting device in proximity to a magnetic field generating article can be accomplished by moving the magnetic field detecting device, by moving the article that is generating the magnetic field or a combination of moving both. The magnetic field generating article can at least in part dictate whether it or the magnetic field detecting device will be moved. In embodiments where the magnetic field generating article is magnetic memory, the magnetic field detecting device can be moved to be proximal with the magnetic field generating article.

Generally, a magnetic field detecting device being in the proximity of a magnetic field generating device refers to the magnetic field detecting device being spatially adjacent to a portion of the magnetic field generating device. As used herein, the phrase spatially adjacent to can refer to magnetic field detecting devices and magnetic field generating articles that are contacting each other or those that are not contacting each other. In embodiments, the magnetic field detecting device can be moved to a position that is spatially adjacent to and not in contact with (or spaced apart from) the magnetic field generating article. In embodiments where the magnetic field generating article is a bit of magnetic recording media, the magnetic field detecting device can be moved to a position that is not in contact with, but spaced apart and on top of (or beneath) the bit of magnetic recording media. Tolerances between the magnetic field generating device and the bit of magnetic recording media can be similar to those commonly used.

When the magnetic field detecting device is not in the proximity of a magnetic field, the free layer of the magnetoresistive stack is in the first plane (as discussed above, the first plane is the plane that is perpendicular to the vertical axis of the device), and is therefore perpendicular (at a 90° angle) the magnetization orientation of the reference layer. When the magnetic field detecting device is in the proximity of a magnetic field from a magnetic filed generating article, the magnetization of the free layer will cant out of the first plane. The magnetization of the free layer when in the proximity of an external magnetic field can be described by two angles: the polar angle with respect to the z axis and the azimuthal angle in the x-y plane. The polar angle is completely determined by the magnetic field of the external magnetic field, while the azimuthal angle is undetermined. This means that the component of the magnetic field in the x-y plane can point in any direction.

The next step in a disclosed method is step 602, directing a current through the magnetic field detecting device. Generally, a current can be directed through the device with the following path: in the reference layer of the magnetoresistive stack and out the free layer of the magnetoresistive stack, in the conducting layer and then in the shielding layer. Alternatively, the path of the current could be reversed. The voltage of the current that is passed through the device can vary and can be chosen at least in part on the application of the device, the components of the device, and the magnetic field generating article that is being monitored.

As discussed above, once a magnetic field detecting device is in the proximity of an external magnetic field, the magnetization of the free layer can be described by two angles: the polar angle with respect to the z axis and the azimuthal angle in the x-y plane. Once a current is directed across the magnetic field detecting device, the resistance of the magnetic field detecting device is completely dependent on the polar angle of the free layer After a current is directed across the magnetic field detecting device (step 602), the next step, step 603, is to measure the resistance of the magnetic field detecting device. As the magnetization orientation of the free layer of the magnetoresistive stack is affected by an external magnetic field, the resistance of the magnetoresistive stack changes. The resistance can then be utilized to detect the magnetic field being generated by the magnetic field generating article. In embodiments, the resistance that is measured can be used to provide further information regarding the magnetic field. For example, in embodiments where the magnetic field generating article is magnetic memory, the measured resistance can be utilized to determine if the magnetic memory contains a "0" or a "1".

As described above, the magnetization orientation of the free layer has two components, the polar angle and the azimuthal angle. Therefore, there is no need to determine the azimuthal angle as it is irrelevant to the resistance of the magnetoresistive stack. Because of the design of devices disclosed herein, the polar angle is the angle between the reference layer and the free layer. Such a design can offer certain advantages in a magnetic field detecting device.

The reader asymmetry mean can be improved. In the absence of a magnetic field, the angle between the free layer and the reference layer is 90°. This is true regardless of the shape of the magnetoresistive stack, i.e. if the stack deviates from a targeted circular or elliptical shape. The reader asymmetry mean is expected to be 0 and the asymmetry sigma much smaller compared to conventionally designed magnetic field detecting devices (for example magnetic memory readers). The improvement in reader asymmetry mean is seen in disclosed devices because the two major contributors (shape variability and permanent magnet bias variability) are completely eliminated in the disclosed devices.

Cross-track shielding, in the case of utilizing the magnetic field detecting device for reading magnetic memory, can be improved over conventionally utilized magnetic field detecting devices. Disclosed devices allow for highly effective magnetic shielding in both down-track and cross-track directions, as opposed to conventional devices that only afford good shielding in down-track directions.

Disclosed devices can be much more reliable than conventional magnetic field detecting devices. Disclosed devices do not utilize antiferromagnetic (AFM) materials. Manganese (Mn) containing AFM layers in conventional magnetic field detecting devices are generally the more susceptible to corrosion than the remainder of the device. By eliminating such materials, the corrosion resistance of the entire magnetic detecting device can be greatly improved. Eliminating Mn can also decrease the possibility of signal degradation that is seen in Mn containing devices because of Mn diffusion during prolonged operation of the devices. Mn diffusion is known to be a significant concern for giant magnetoresistance (GMR) and read-back signal deterioration in magnetic memory readers.

Disclosed devices can be more thermally robust and provide better resistance to electrical stresses. The reference layer in magnetoresistive stacks of magnetic field detecting devices can be constructed using materials that have very large perpendicular anisotropy and can be made magnetically very stable. Such materials can eliminate issues related to de-pinning or rotation of the reference layer due to heating, which are a significant concern when using AFM materials because of their relatively low blocking temperatures (about 250°).

A larger and more uniform signal can be seen by the magnetic field detecting device, in comparison to conventional magnetic field detecting devices. This is generally the case because the free layer in disclosed magnetic field detecting devices is relatively thin, therefore, the entire free layer is close to the air bearing surface (ABS) of the device, and the magnetic field to be detected. When compared to a conventional magnetic memory reader (for example) as the thickness of the free layer increases (because it has to be stabilized), the distance from the free layer to the magnetic field to be detected increases. As the distance increases, the magnetic field to be detected exponentially decays. In embodiments, this can lead to a signal that is almost three (3) times larger than that seen by conventional magnetic field detecting devices.

Disclosed devices can also reduce the large 1/f type of magnetic noise, seen in commonly utilized magnetic media readers, because such noise is caused by random telegraph noise jumps between multiple metastable magnetic states in either the free layer or synthetic AFM layers. Disclosed devices can utilize magnetically hard reference layers by using materials having very large perpendicular anisotropy. The electrical current that passes through the reference layer will get spin polarized and subsequently exercise a torque on the free layer through the spin momentum transfer effect. If the spin polarization efficiency of the reference layer and the bias current amplitude are chosen properly it can force the free layer into a stable precession. Such a precession can put the free layer on a stable magnetic trajectory and reduce the random telegraph noise jumps and the 1/f magnetic noise.

The stable precession of the free layer can be even further enhanced to further minimize the noise due to random telegraph noise jumps. FIG. 6 indicates an optional step, step 604, which is to spin the magnetic orientation of the free layer of the magnetoresistive stack. Spinning the magnetic orientation of the free layer, or causing the magnetic orientation of the free layer to oscillate, forces the magnetization into a well defined magnetic state, which further reduces the likelihood that the magnetization will jump to another metastable magnetic state.

The magnetic orientation of the free layer can be forced to oscillate (or phase locked) using one of two methods. In embodiments, the oscillations can be induced by using the spin momentum transfer from a relatively large DC biasing current. In embodiments, a DC biasing current that is at least about 50 microamps (µA) can be utilized. In embodiments, a DC biasing current that is from about 50 µA to about 1 milliamps (mA) can be utilized. The second method of phase locking the magnetic oscillations is to apply a DC biasing current and an AC current that has a frequency equal to the natural spin momentum transfer oscillation frequency of the spin in the free layer. In embodiments where a AC current having the frequency of the magnetic oscillations is applied to the device, the additional AC frequency can easily be filtered from the readback signal of the device because the AC frequency will be an order of magnitude higher than that of the highest magnetic recording frequencies.

Thus, embodiments of MAGNETIC FIELD DETECTING DEVICE AND METHODS OF USING THE SAME are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A device, the device having an air bearing surface (ABS), and the device comprising:
a magnetoresistive stack,
the magnetoresistive stack comprising a free layer, a spacer layer, and a reference layer, wherein the spacer layer is positioned between the free and reference layers,
wherein the free layer forms a first surface of the magnetoresistive stack and the reference layer forms a second surface of the magnetoresistive stack, the device having a principle axis, the principle axis running along the free layer, the spacer layer, and the reference layer, and through the first and second surfaces of the magnetoresistive stack, and wherein the first and second surfaces of the magnetoresistive stack are parallel to the ABS of the device, and the principle axis of the device is perpendicular to the ABS of the device;
the free layer comprising a magnetic material having a free magnetic orientation in a first plane; the spacer layer comprising a nonmagnetic material; and the reference layer comprising a magnetic material having a pinned magnetic orientation in a second plane, wherein the second plane is perpendicular to the first plane and parallel to the principle axis of the device;
an insulating layer positioned around the periphery of the magnetoresistive stack;
a shielding layer positioned around the periphery of the insulating layer; and
a conducting layer positioned adjacent the first surface of the magnetoresistive stack.

2. The device according to claim 1, wherein the insulating layer surrounds all but the first and second surfaces of the magnetoresistive stack.

3. The device according to claim 1, wherein the insulating layer surrounds all of an outer surface of the magnetoresistive stack.

4. The device according to claim 1, wherein the conducting layer covers the entire first surface of the magnetoresistive stack.

5. The device according to claim 1, wherein the conducting layer defines the ABS of the device.

6. The device according to claim 5, wherein the conducting layer comprises a bi-layer of a conductive material and a diamond like overcoat.

7. The device according to claim 6, wherein the conductive material comprises a conductive nonmetallic material.

8. The device according to claim 1 further comprising a current source.

9. The device according to claim 8, wherein the current source is configured to drive current through the magnetoresistive stack from the first surface to the second surface or the second surface to the first surface.

10. The device according to claim 8, wherein the current source is configured to drive current through the magnetoresistive stack to the conducting layer and then to the shielding layer or through the shielding layer to the conducting layer then through the magnetoresistive stack.

11. A device, the device having an air bearing surface (ABS), and the device comprising:
   a magnetic writer; and
   a magnetic reader, the magnetic reader comprising:
      a magnetoresistive stack,
         the magnetoresistive stack comprising a free layer, a spacer layer, and a reference layer, wherein the spacer layer is positioned between the free and reference layers,
         wherein the free layer forms a first surface of the magnetoresistive stack and the reference layer forms a second surface of the magnetoresistive stack, the device having a principle axis, the principle axis running along the free layer, the spacer layer, and the reference layer, and through the first and second surfaces of the magnetoresistive stack, and wherein the first and second surfaces of the magnetoresistive stack are parallel to the ABS of the device, and the principle axis of the device is perpendicular to the ABS of the device;
      the free layer comprising a magnetic material having a free magnetic orientation in a first plane; the spacer layer comprising a nonmagnetic material; and the reference layer comprising a magnetic material having a pinned magnetic orientation in a second plane, wherein the second plane is perpendicular to the first plane and parallel to the principle axis of the device;
      an insulating layer positioned around the periphery of the magnetoresistive stack;
      a shielding layer positioned around the periphery of the insulating layer; and
      a conducting layer positioned adjacent the first surface of the magnetoresistive stack.

12. The device according to claim 11, wherein the insulating layer surrounds all but the first and second surfaces of the magnetoresistive stack.

13. The device according to claim 11, wherein the conducting layer defines the ABS of the device.

14. The device according to claim 11, wherein the conducting layer covers the entire first surface of the magnetoresistive stack.

15. The device according to claim 13, wherein the conducting layer comprises a bi-layer of a conductive material and a diamond like overcoat.

16. The device according to claim 15, wherein the conductive material comprises a conductive nonmetallic material.

17. The device according to claim 11 further comprising a current source.

18. The device according to claim 17, wherein the current source is configured to drive current through the magnetoresistive stack from the first surface to the second surface or the second surface to the first surface.

19. The device according to claim 17, wherein the current source is configured to drive current through the magnetoresistive stack to the conducting layer and then to the shielding layer or through the shielding layer to the conducting layer then through the magnetoresistive stack.

* * * * *